(12) United States Patent
Kawai et al.

(10) Patent No.: US 10,361,274 B2
(45) Date of Patent: Jul. 23, 2019

(54) SILICON CARBIDE SEMICONDUCTOR DEVICE HAVING METAL SILICIDE SURROUNDS A PERIPHERAL OF METAL CARBIDE

(71) Applicant: DENSO CORPORATION, Kariya, Aichi-pref. (JP)

(72) Inventors: Jun Kawai, Kariya (JP); Kazuhiko Sugiura, Kariya (JP); Yasuji Kimoto, Nagakute (JP); Kayo Kondo, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/772,125

(22) PCT Filed: Feb. 28, 2017

(86) PCT No.: PCT/JP2017/007590
§ 371 (c)(1),
(2) Date: Apr. 30, 2018

(87) PCT Pub. No.: WO2017/187760
PCT Pub. Date: Nov. 2, 2017

(65) Prior Publication Data
US 2018/0323261 A1  Nov. 8, 2018

(30) Foreign Application Priority Data
Apr. 27, 2016  (JP) .................... 2016-89578

(51) Int. Cl.
*H01L 29/16* (2006.01)
*H01L 21/28* (2006.01)
*H01L 21/02* (2006.01)
*H01L 21/268* (2006.01)
*H01L 29/417* (2006.01)
(Continued)

(52) U.S. Cl.
CPC .... *H01L 29/1608* (2013.01); *H01L 21/02378* (2013.01); *H01L 21/268* (2013.01); *H01L 21/28* (2013.01); *H01L 29/41725* (2013.01); *H01L 29/456* (2013.01); *H01L 29/66068* (2013.01)

(58) Field of Classification Search
CPC .......... H01L 29/1608; H01L 29/41725; H01L 29/41791; H01L 29/66795; H01L 29/785; H01L 27/0924; H01L 27/10841
See application file for complete search history.

(56) References Cited

U.S. PATENT DOCUMENTS

2017/0271509 A1* 9/2017 Iwaya ................ H01L 21/8238

FOREIGN PATENT DOCUMENTS

| JP | 2008-130874 A | 6/2008 |
|---|---|---|
| JP | 2010-205824 A | 9/2010 |
| JP | 2016-046311 A | 4/2016 |

* cited by examiner

*Primary Examiner* — Hoai V Pham
(74) *Attorney, Agent, or Firm* — Posz Law Group, PLC

(57) ABSTRACT

A silicon carbide semiconductor device includes: a semiconductor substrate that has a front surface and a rear surface, and is made of silicon carbide; and an ohmic electrode that is ohmically connected to the front surface or the rear surface of the semiconductor substrate. The ohmic electrode includes a metal silicide part and a metal carbide part. The metal silicide part surrounds a periphery of the metal carbide part that has a block shape. The metal silicide part is disposed between the semiconductor substrate and the metal carbide part.

6 Claims, 13 Drawing Sheets

(51) Int. Cl.
*H01L 29/45* (2006.01)
*H01L 29/66* (2006.01)

SILICON CARBIDE SEMICONDUCTOR DEVICE HAVING METAL SILICIDE SURROUNDS A PERIPHERAL OF METAL CARBIDE

CROSS REFERENCE TO RELATED APPLICATION

This application is a U.S. national stage application of International Application No. PCT/JP2017/007590 filed on Feb. 28, 2017 and is based on Japanese Patent Application No. 2016-89578 filed on Apr. 27, 2016, the disclosures of which are incorporated herein by reference.

TECHNICAL FIELD

The present disclosure relates to a SiC semiconductor device that is capable of reducing a contact resistance of an ohmic electrode of a semiconductor element which is formed of silicon carbide (referred to as SiC, hereinafter), and a method for producing the same.

BACKGROUND

In the related art, when a semiconductor element such as a vertical power device is formed using a SiC substrate, in order to reduce a substrate resistance, it has been checked grinding a rear surface side of the SiC substrate to make a thin plate, after various impurity layers or electrodes which form the device are formed on a front surface side. In this case, there is a need to form an ohmic electrode on the rear surface side, after grinding the rear surface side of the SiC substrate. However, when the ohmic electrode is formed, various impurity layers or electrodes which form the device are already provided on the front surface side of the SiC substrate. Thus, there is a need to set a configuration such that thermal damage is not applied to the impurity layers or the electrodes. For example, as a technology for not applying the thermal damage, a laser annealing technology which is capable of performing local heating is used.

When the ohmic electrode is formed using the laser annealing or the like, for example, nickel (Ni) or the like is used as an electrode material, and silicide is made by performing a bonding with Si which is included in the SiC to obtain an ohmic connection. On the other hand, C which is included in the SiC precipitates as a graphite at an interface between the ohmic electrode and the SiC. Therefore, generation of the graphite is prevented, using a metal such as molybdenum (Mo) which makes carbide, in addition to the electrode material for forming the ohmic electrode (see Patent Literature 1).

PRIOR ART LITERATURES

Patent Literature

Patent Literature 1: JP-A-2010-205824

SUMMARY

Metal carbide such as Mo carbide has a high resistance in comparison with metal silicide such as Ni silicide, and the metal carbide is provided to adhere to the interface with the SiC. Thus, it is not capable of obtaining favorable ohmic characteristics.

It is an object of the present disclosure to provide a SiC semiconductor device that is capable of obtaining more favorable ohmic characteristics, and a method for producing the same.

According to a first aspect of the present disclosure, a silicon carbide semiconductor device includes: a semiconductor substrate that has a front surface and a rear surface, and is made of silicon carbide; and an ohmic electrode that is ohmically connected to the front surface or the rear surface of the semiconductor substrate. The ohmic electrode includes a metal silicide part and a metal carbide part. The metal silicide part surrounds a periphery of the metal carbide part that has a block shape. The metal silicide part is disposed between the semiconductor substrate and the metal carbide part.

In the silicon carbide semiconductor device, reduction of a contact resistance can be achieved, by setting a structure which is capable of preventing precipitation of a graphite such that a metal carbide part is generated in a structure in which a metal silicide part is generated. Moreover, a structure in which the metal silicide part enters into a gap between the metal carbide part and a semiconductor substrate, while the metal carbide part is formed into a block shape, is set. Therefore, a contact area between the metal silicide part and the SiC is increased, an electrical current path can be expanded, and the contact resistance can be further reduced. Accordingly, further favorable ohmic characteristics are obtained.

According to a second aspect of the present disclosure, a method for producing a silicon carbide semiconductor device which is provided with an ohmic electrode ohmically connected to a front surface or a rear surface of a semiconductor substrate that has the front surface and the rear surface, and is made of silicon carbide, the method includes: forming a first metallic material film and a second metallic material film on the front surface or the rear surface of the semiconductor substrate using first metallic material including a metal element for producing a metal silicide part and second metallic material including a metal element for producing a metal carbide part; and forming the metal carbide part having a block shape using the metal element included in the second metallic material and a carbon in silicon carbide, and forming the metal silicide part surrounding a periphery of the metal carbide part and disposed between the semiconductor substrate and the metal carbide part using the metal element included in the first metallic material and a silicon in silicon carbide, by irradiating the first metallic material and the second metallic material with a laser beam having an energy density equal to or more than 1.4 J/cm$^2$.

In the method for producing the silicon carbide semiconductor device, the reduction of the contact resistance can be achieved, by setting the structure which is capable of preventing the precipitation of the graphite such that the metal carbide part is generated in the structure in which the metal silicide part is generated. Moreover, the structure in which the metal silicide part enters into the gap between the metal carbide and the semiconductor substrate, while the metal carbide part is formed into the block shape, is set. Therefore, the contact area between the metal silicide part and the SiC is increased, the electrical current path can be expanded, and the contact resistance can be further reduced. Accordingly, further favorable ohmic characteristics are obtained.

BRIEF DESCRIPTION OF DRAWINGS

The above and other objects, features and advantages of the present disclosure will become more apparent from the following detailed description made with reference to the accompanying drawings. In the drawings:

FIG. 2A is represented by a line chart;

FIG. 6A is represented by a line chart;

EMBODIMENTS

Figure 1:
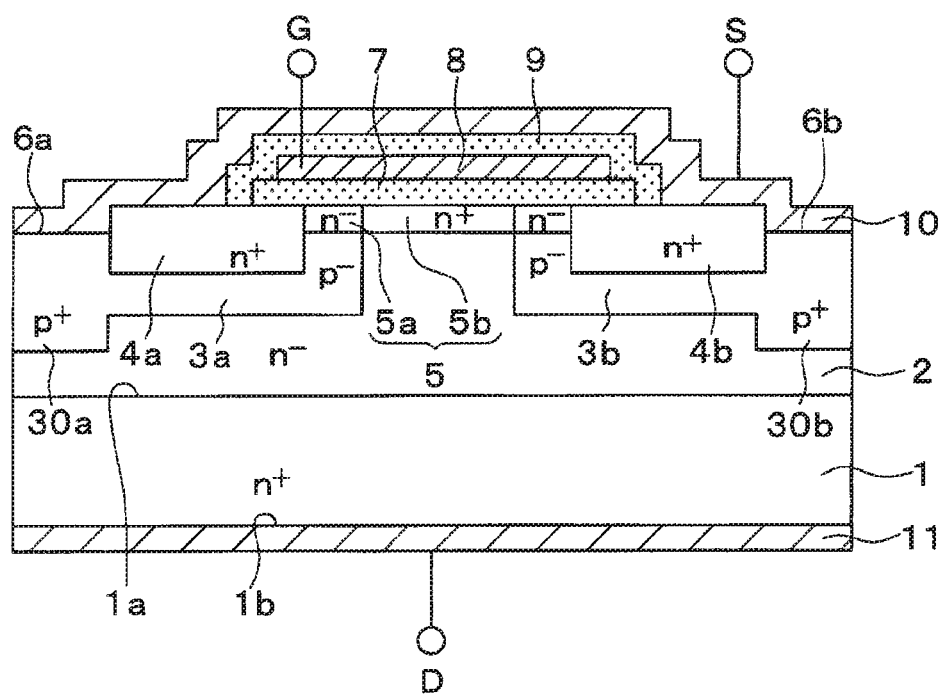
FIG. 1 is a sectional view of a SiC semiconductor device according to a first embodiment.

Hereinafter, embodiments of the present disclosure will be described based on the drawings. In each of the following embodiments, the same reference signs are attached to portion which are the same or are equivalent to each other, and the description thereof will be performed.

First Embodiment

Hereinafter, the present disclosure will be described with reference to the embodiments illustrated in the drawings. First, referring to FIG. 1, a SiC semiconductor device according to the present embodiment will be described. In the present embodiment, the SiC semiconductor device that includes a vertical power MOSFET of a planar type as a vertical semiconductor element will be described. For example, the present SiC semiconductor device is suitable to be applied to an inverter.

The vertical power MOSFET is provided using an n+-type SiC substrate 1. The n+-type SiC substrate 1 has an upper surface as a main front surface 1a, and a lower surface which is opposite to the main front surface 1a as a rear surface 1b, and is formed of single crystal SiC. For example, as an n+-type SiC substrate 1, the substrate of which an impurity concentration is 1×10$^{18}$ cm$^{-3}$ is used.

On the main front surface 1a of the n+-type SiC substrate 1, an n−-type epitaxial layer (referred to an n−-type epi-layer, hereinafter) 2 that is formed of the SiC having a dopant concentration which is lower than that of the n+-type SiC substrate 1, is stacked.

In a predetermined region of a surface layer portion of the n−-type epi-layer 2, p-type base regions 3a and 3b having predetermined depths are provided apart from each other. The p-type base regions 3a and 3b include deep base layers 30a and 30b of which a portion becomes large in thickness. The deep base layers 30a and 30b are provided in a portion which does not overlap with n+-type source regions 4a and 4b described later. In the p-type base regions 3a and 3b, the impurity concentration of a portion of the large thickness where the deep base layers 30a and 30b are provided, becomes higher than that of a portion of the small thickness where the deep base layers 30a and 30b are not provided. By forming such deep base layers 30a and 30b, an electric field intensity between the n+-type SiC substrate 1 and the deep base layers 30a and 30b can be enhanced, and an avalanche breakdown can be likely to be made at the position.

In a predetermined region of the surface layer portion of the p-type base region 3a, the n+-type source region 4a which is shallower than the p-type base region 3a, is provided. In a predetermined region of the surface layer portion of the p-type base region 3b, the n+-type source region 4b which is shallower than the p-type base region 3b, is provided.

Furthermore, an n-type SiC layer 5 which is formed of an n−-type layer 5a and an n+-type layer 5b, is extended on the front surface portion of the n−-type epi-layer 2 and the p-type base regions 3a and 3b between the n+-type source region 4a and the n+-type source region 4b. That is, the n-type SiC layer 5 is disposed to link the source regions 4a and 4b and the n−-type epi-layer 2 in the front surface portion of the p-type base regions 3a and 3b. The n-type SiC layer 5 functions as a channel forming layer on a device front surface at the time of operating the device. Hereinafter, the n-type SiC layer 5 is referred to as a front surface channel layer.

For example, the front surface channel layer 5 is provided by performing ion implantation of an n-type impurity into the front surface portion of the n−-type epi-layer 2 and the p-type base regions 3a and 3b. A dopant concentration of the n−-type layer 5a which is disposed in an upper portion of the p-type base regions 3a and 3b in the front surface channel layer 5, is lower than or equal to the dopant concentration of the n−-type epi-layer 2 and the p-type base regions 3a and 3b. The dopant concentration of the n+-type layer 5b which is provided in the front surface portion of the n−-type epi-layer 2, is higher than that of the n−-type epi-layer 2. Thereby, making of low on-resistance is achieved.

Depression portions 6a and 6b are provided in the front surface portions of the p-type base regions 3a and 3b and the n+-type source regions 4a and 4b, and the deep base layers 30a and 30b of which the p-type impurity concentrations are high are exposed from a bottom portion of the depression portions 6a and 6b.

A gate insulating film 7 which is formed of a silicon oxide film or the like, is provided on the upper surface of the front surface channel layer 5 and the upper surface of the n+-type source regions 4a and 4b. Furthermore, a gate electrode 8 is provided on the gate insulating film 7, and the gate electrode 8 is covered with an insulating film 9 which is formed of a silicon oxide film or the like. A source electrode 10 is provided thereon, and the source electrode 10 is connected to $n^+$-type source regions 4a and 4b, and the p-type base regions 3a and 3b.

On the rear surface 1b of the $n^+$-type SiC substrate 1, a drain electrode 11 is provided. The drain electrode 11 is an ohmic electrode that is ohmically connected to the rear surface 1b of the $n^+$-type SiC substrate 1. The drain electrode 11 is formed using a first metallic material such as Ni, cobalt (Co), or niobium (Nb) which forms metal silicide, and a second metallic material such as Mo, titanium (Ti), Nb, tungsten (W), or tantalum (Ta) which forms metal carbide. Here, a case where Ni is used as a first metallic material, and Mo is used as a second metallic material will be described as an example.

Figure 2A:
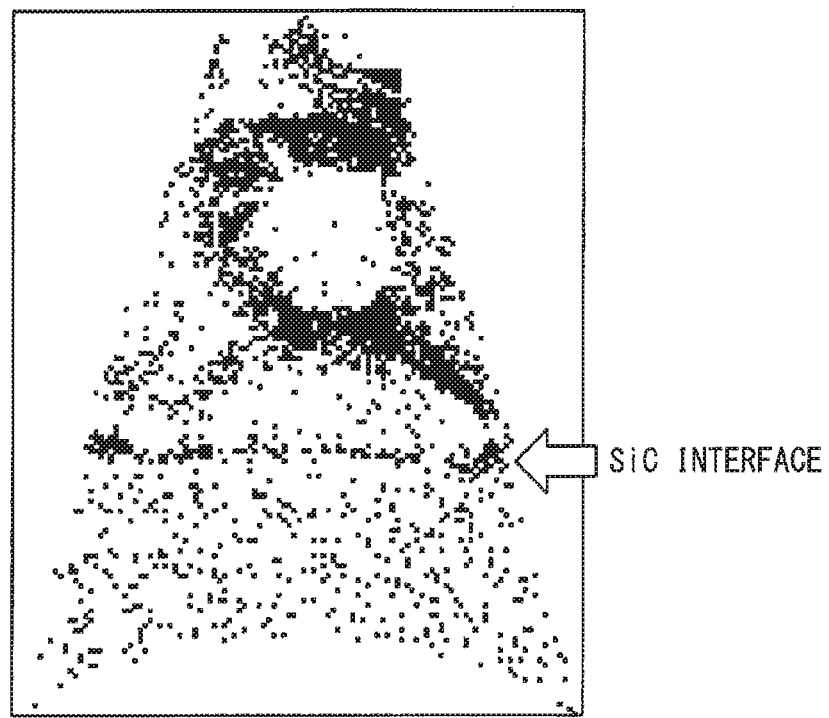
FIG. 2A is a sectional atomic map of a Ni element of a contact portion between an n+-type SiC substrate and a drain electrode in the SiC semiconductor device illustrated in FIG. 1.
Figure 2B:
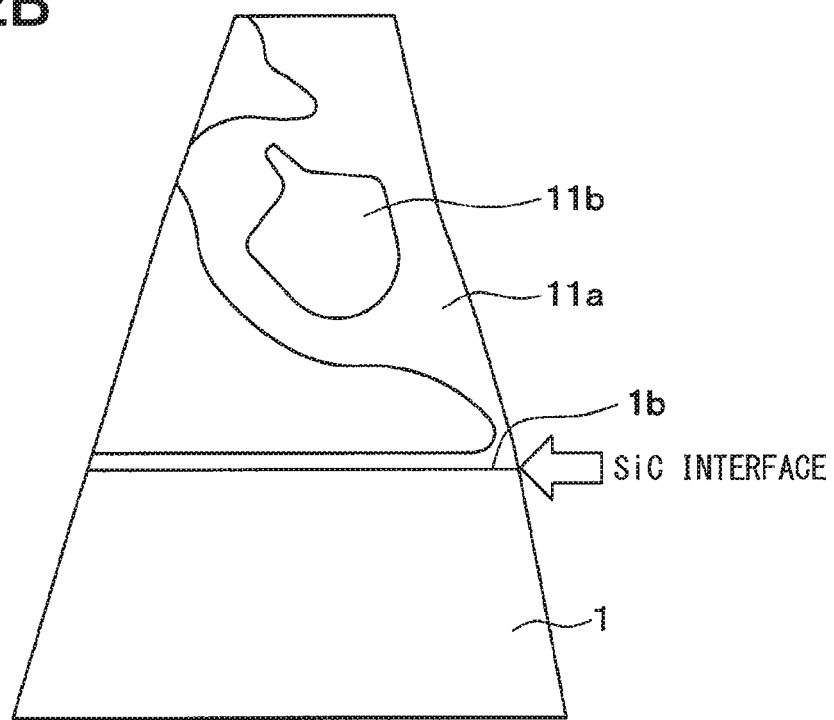
FIG. 2B is a diagram in a case where

When a contact portion of the drain electrode 11 which forms the ohmic electrode is enlarged, a state illustrated in FIGS. 2A and 2B is made. When the drawings are schematically illustrated, a state as illustrated in FIG. 3 is made.

Figure 3:
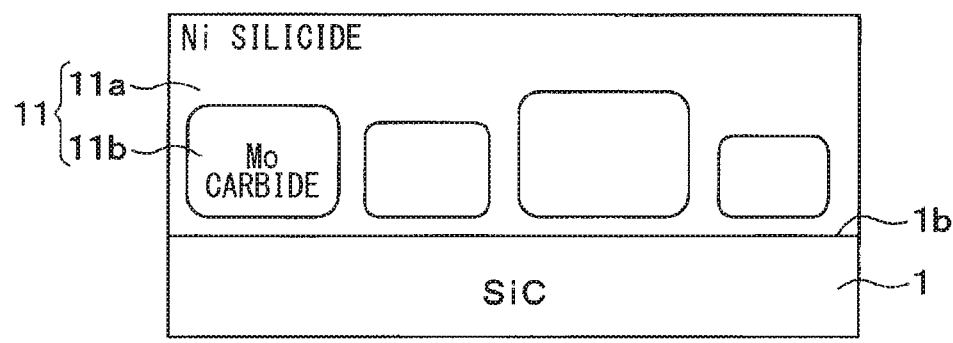
FIG. 3 is a schematic sectional view of the contact portion between the n+-type SiC substrate and the drain electrode in the SiC semiconductor device illustrated in FIG. 1.

As illustrated in FIGS. 2A, 2B and 3, in the present embodiment, the drain electrode 11 is formed to contain Ni silicide 11a in which Ni is bonded to Si, and Mo carbide 11b in which Mo is bonded to C.

The Mo carbide 11b is formed of Mo carbide, and is formed into a block shape having crystallinity, and the Mo carbides 11b are dotted in the vicinity of an interface with the SiC in the drain electrode 11. More specifically, as illustrated in FIG. 3, the Mo carbides 11b of the block shape are dotted on the rear surface of the $n^+$-type SiC substrate 1. The block shape referred to herein means a state of being into a unity, and a size and a shape are optional. For example, the Mo carbide 11b is formed of each block having a maximum dimension which is 3 nm or more and 40 nm or less.

The Ni silicide 11a is present in a state where Ni—Si is amorphous, and is provided to be in contact with at least the interface with the SiC in the drain electrode 11. Specifically, the Ni silicide 11a is provided to surround a periphery of the Mo carbide 11b, and is provided to be interposed between the Mo carbide 11b and the SiC. That is, the Mo carbide 11b is in a state of being separated from the rear surface of the $n^+$-type SiC substrate 1, and the Ni silicide 11a is in a state of entering into a gap between the Mo carbide 11b and the rear surface of the $n^+$-type SiC substrate 1.

The thickness of the Ni silicide 11a entering into a space between the Mo carbide 11b and the rear surface of the $n^+$-type SiC substrate 1, in other words, a distance between the Mo carbide 11b and the $n^+$-type SiC substrate 1 is, for example, 1 nm or more and 3 nm or less. The thickness of the Ni silicide 11a referred to herein indicates the thickness at a position where the distance between the Mo carbide 11b and the $n^+$-type SiC substrate 1 is the shortest distance.

By the above structure, the SiC semiconductor device including the vertical semiconductor element according to the present embodiment is formed.

Next, a method for producing the vertical power MOSFET illustrated in FIG. 1 will be described. However, the basic method for producing the vertical power MOSFET according to the present embodiment is the same as that of the related art. Thus, a method for forming the drain electrode 11 which is different from that of the related art will be mainly described.

The vertical power MOSFET according to the present embodiment is produced through each producing step illustrated in FIG. 4A to FIG. 4D.

Figure 4A:
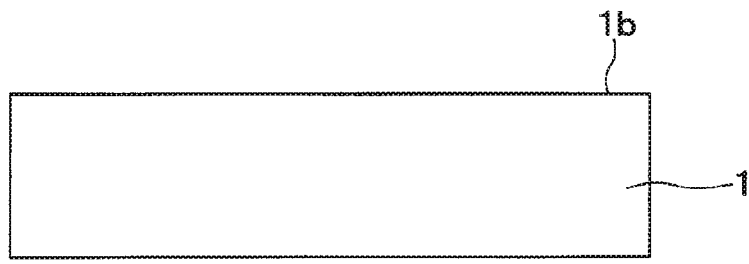
FIGS. 4A to 4D are sectional views illustrating a forming step of the drain electrode in the SiC semiconductor device illustrated in FIG. 1.

First, as illustrated in FIG. 4A, for example, the $n^+$-type SiC substrate 1 which is formed to have the thickness of 350·m is prepared. For example, after a SiC ingot which is doped with the n-type impurity is sliced, the sliced ingot is polished, thereby, the $n^+$-type SiC substrate 1 is produced. Therefore, although not illustrated in the drawing, a device forming step of forming at least a portion of components of the semiconductor element is performed on the front surface side of the $n^+$-type SiC substrate 1. That is, after the $n^-$-type epi-layer 2 is epitaxially grown, the ion implantation is performed using a mask which is not illustrated in the drawing, thereby, the forming steps of the p-type base regions 3a and 3b and the deep base layers 30a and 30b, the forming step of the $n^+$-type source regions 4a and 4b, and the forming step of the front surface channel layer 5 are performed. Furthermore, the forming step of the gate insulating film 7, the forming step of the gate electrode 8, the forming step of the insulating film 9, the forming step of the source electrode 10, and the like are performed, thereby, each component of the vertical power MOSFET as a device is formed.

Although not illustrated in the drawing, a portion of the rear surface 1b side of the $n^+$-type SiC substrate 1 is removed by grinding and polishing, and the $n^+$-type SiC substrate 1 is thinned. Therefore, the steps illustrated in FIGS. 4B to 4D are performed, thereby, the step of forming the drain electrode 11 on the rear surface 1b of the $n^+$-type SiC substrate 1 after the thinning is performed.

Figure 4B:
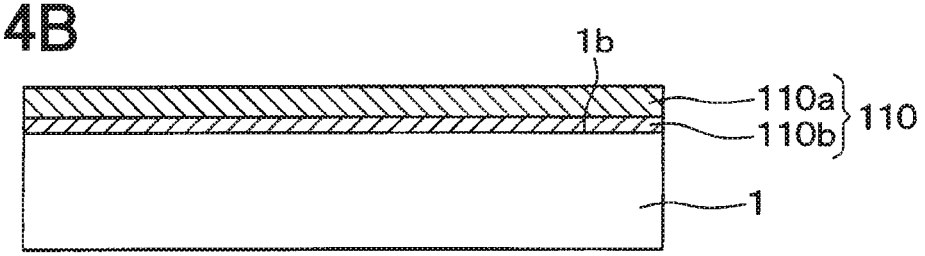

Specifically, as a step illustrated in FIG. 4B, a metal thin film 110 is formed on the rear surface 1b of the $n^+$-type SiC substrate 1 after the thinning. For example, a second metallic material 110b such as Mo and a first metallic material 110a such as Ni are formed in sequence on the rear surface 1b of the $n^+$-type SiC substrate 1, thereby, the metal thin film 110 is formed on the rear surface 1b of the $n^+$-type SiC substrate 1. When Ni is used as a first metallic material 110a, and Mo is used as a second metallic material 110b, for example, a film thickness of Ni is set to be 100 nm, and the film thickness of Mo is set to be 70 nm. For example, the first metallic material 110a and the second metallic material 110b are formed by vapor deposition or sputtering.

Figure 4C:
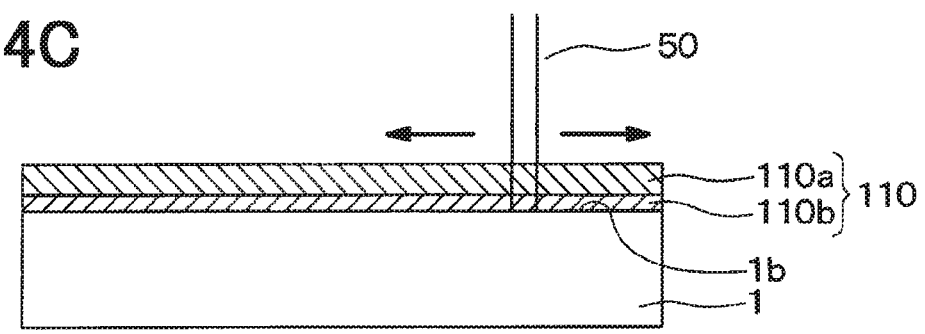
Figure 4D:
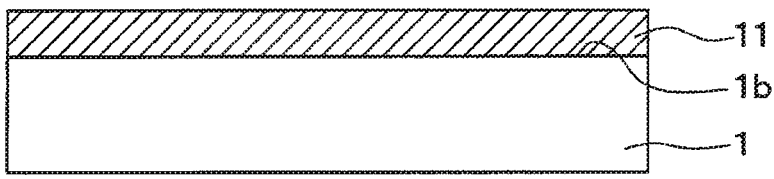

Next, as a step illustrated in FIG. 4C, laser annealing is performed by irradiating the metal thin film 110 with a laser beam 50. For example, the $n^+$-type SiC substrate 1 on which the metal thin film 110 is provided is scanned on an X-Y plane while scanning is performed, using a solid-state laser such as an LD excitation solid-state laser, and the rear surface 1b side of the $n^+$-type SiC substrate 1 is irradiated with the laser beam 50. For example, the local laser annealing in which the laser beam irradiation is performed by a chip unit, is performed. In this manner, the local annealing such as the laser annealing is performed, thereby, the drain electrode 11 can be ohmically connected due to a low temperature process that is capable of preventing a temperature increase of the region on which the laser irradiation is not performed. Therefore, an influence on the device which is provided on the front surface 1a side of the $n^+$-type SiC substrate 1, can be prevented.

At this time, for example, using the solid-state laser of which a fundamental wavelength is 1064 nm, the laser beam that is converted into 355 nm which becomes a triple wave or 266 nm which becomes a quadruple wave by a wavelength conversion adapter is used as a laser beam 50. The wavelength is set to be such a wavelength, thereby, the laser beam 50 can be made not to pass through the SiC. An energy density of the laser beam 50 is set to be 1.4 J/cm$^2$ or more, for example, 1.4 to 2.0 J/cm$^2$.

Thereby, a metal element forming the first metallic material 110a and Si included in the n+-type SiC substrate 1 are caused to react with each other to make silicide, and the metal silicide can be generated. Moreover, a metal element forming the second metallic material 110b and C included in the n+-type SiC substrate 1 are caused to react with each other, and the metal carbide is generated. As in the present embodiment, when the first metallic material 110a is formed of Ni, and the second metallic material 110b is formed of Mo, as illustrated in FIGS. 2A, 2B and 3, the Ni silicide 11a is generated as metal silicide, and the Mo carbide 11b is generated as metal carbide. In this manner, not only the first metallic material 110a but also the second metallic material 110b are used, thereby, the metal carbide can be generated, thus, a graphite can be prevented from being precipitated likewise a case where the second metallic material 110b is not used. Accordingly, an increase of a contact resistance which is generated when the graphite is precipitated, can be prevented.

In this manner, the drain electrode 11 is provided as illustrated in FIG. 4D, but at the time of the laser annealing when the drain electrode 11 is formed, the energy density of the laser beam 50 is set to be 1.4 J/cm² or more. Therefore, as illustrated in FIGS. 2A, 2B, and 3, the Mo carbide 11b can be formed into a block shape, and a structure in which the periphery of the Mo carbide 11b is surrounded by the Ni silicide 11a, and the Ni silicide 11a enters into the space between the Mo carbide 11b and the SiC, can be made. This will be described with reference to a test result.

The present inventors search for the contact resistance of the drain electrode 11 in a case where the energy density of the laser beam 50 is changed in the laser annealing with the solid-state laser, using the metallic material which generates the metal silicide and the metallic material which generates the metal carbide. Here, the test is performed in a case where the energy density of the laser beam 50 is changed between 0.4 and 2.0 J/cm². As a result, the present inventors find out that the contact resistance of the drain electrode 11 is changed in accordance with the energy density.

Figure 5:
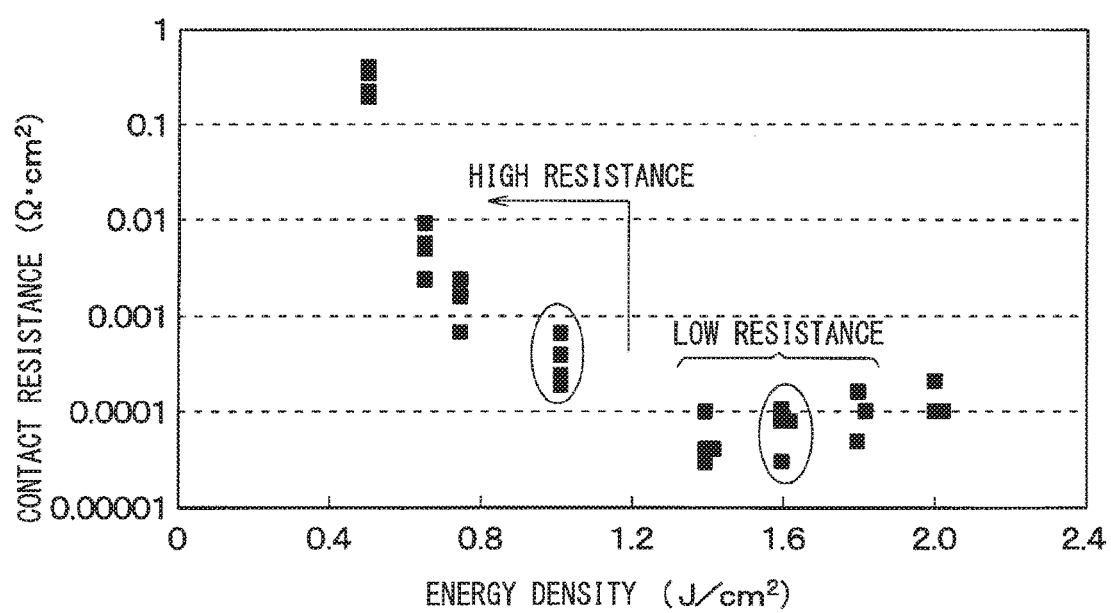
FIG. 5 is a diagram illustrating a relationship between an energy density and a contact resistance.

FIG. 5 is a diagram obtained by plotting the results per sample on which the test is performed. As illustrated in FIG. 5, it is understood that the contact resistance of the drain electrode 11 is changed in accordance with the energy density. Specifically, when the energy density of the laser beam 50 is set to be 0.4 J/cm², the contact resistance becomes a value which is larger than 0.1 Ω·cm², and when the energy density is up to approximately 1.0 J/cm², the contact resistance becomes the relatively large value which is approximately 0.05 Ω·cm². On the contrary, when the energy density is in a range of 1.4 to 1.6 J/cm², the contact resistance is reduced up to 0.0001 Ω·cm² or less. When the energy density becomes further high, it is understood that the contact resistance is slightly increased, but becomes approximately 0.0001 Ω·cm², and the contact resistance becomes low.

Figure 6A:
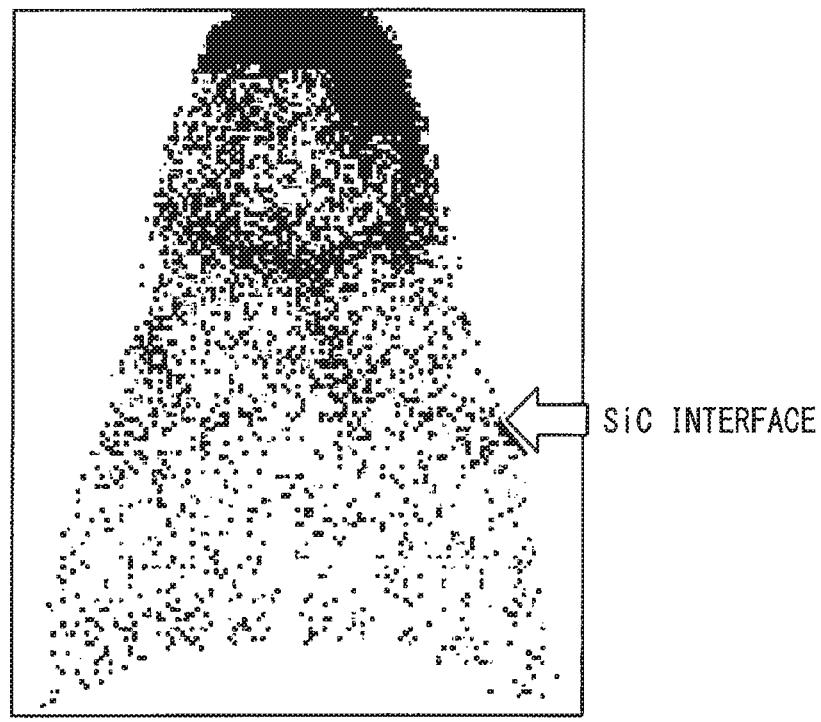
FIG. 6A is a sectional atomic map of a Ni element of a contact portion between an n+-type SiC substrate and a drain electrode illustrated as Comparative Example.
Figure 6B:
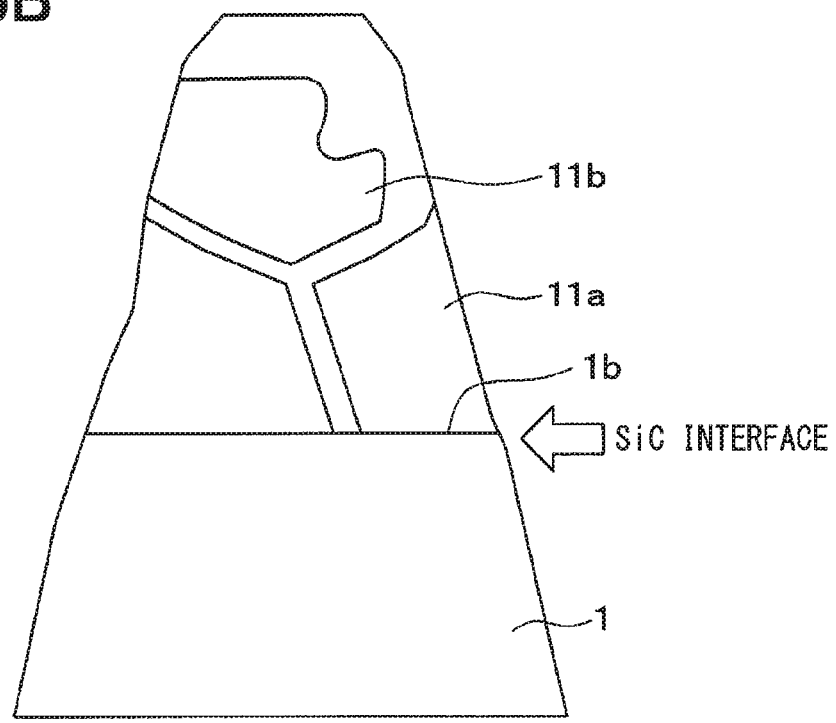
FIG. 6B is a diagram in a case where
Figure 7:
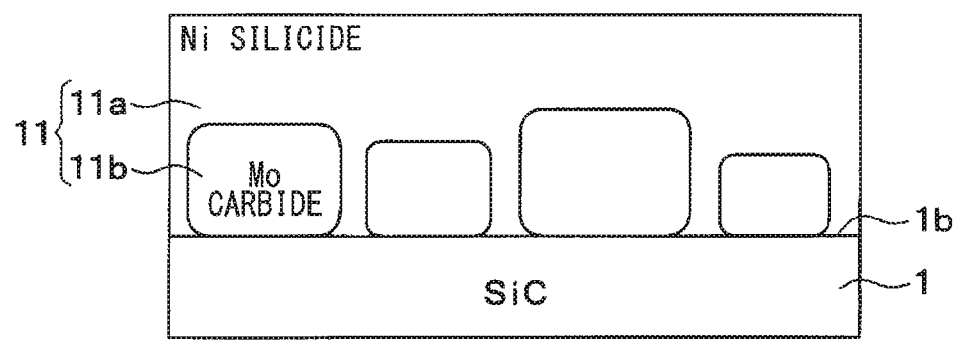
FIG. 7 is a schematic sectional view of the contact portion between the n+-type SiC substrate and the drain electrode in Comparative Example.

In order to search for a cause of obtaining such a result, the present inventors search for the structure of the contact portion with the SiC in the drain electrode 11. FIGS. 2A, 2B, and 3 illustrate a state when the energy density of the laser beam 50 is set to be 1.6 J/cm². FIGS. 6A, 6B and 7 illustrate a state when the energy density of the laser beam 50 is set to be 1.0 J/cm².

As illustrated in FIGS. 2A, 2B, and 3, when the energy density of the laser beam 50 is set to be 1.4 J/cm² or more, the Mo carbide 11b of the block shape is in a state of being separated from the rear surface 1b of the n+-type SiC substrate 1. Therefore, a state where the Ni silicide 11a enters into the gap between the Mo carbide 11b and the rear surface 1b of the n+-type SiC substrate 1, is made. On the contrary, as illustrated in FIGS. 6A, 6B and 7, when the energy density of the laser beam 50 is set to be 1.0 J/cm² or less, the Mo carbide 11b is in a state of adhering to the rear surface of the n+-type SiC substrate 1. Such a structural difference is considered that a difference is made in migration of Ni in accordance with the energy density of the laser beam 50. When the energy density of the laser beam 50 is set to be 1.4 J/cm² or more, Ni encircles the space between the Mo carbide 11b and the rear surface 1b of the n+-type SiC substrate 1 due to the migration, and the silicide 11a is also generated in the space therebetween. Therefore, it is assumed that the structure as illustrated in FIGS. 2A, 2B, and 3 is realized.

In order to search for a state of the contact portion with the SiC in the drain electrode 11 in more detail, an element analysis of a case where the energy density of the laser beam 50 is set to be 0.7 to 2.0 J/cm² is performed, by an auger electron spectroscopy (AES). Specifically, the element analysis is performed, in a cross section of the drain electrode 11 passing through the position where the Mo carbide 11b is provided. As a result, the results illustrated in FIGS. 8A to 8F are obtained.

Figure 8A:
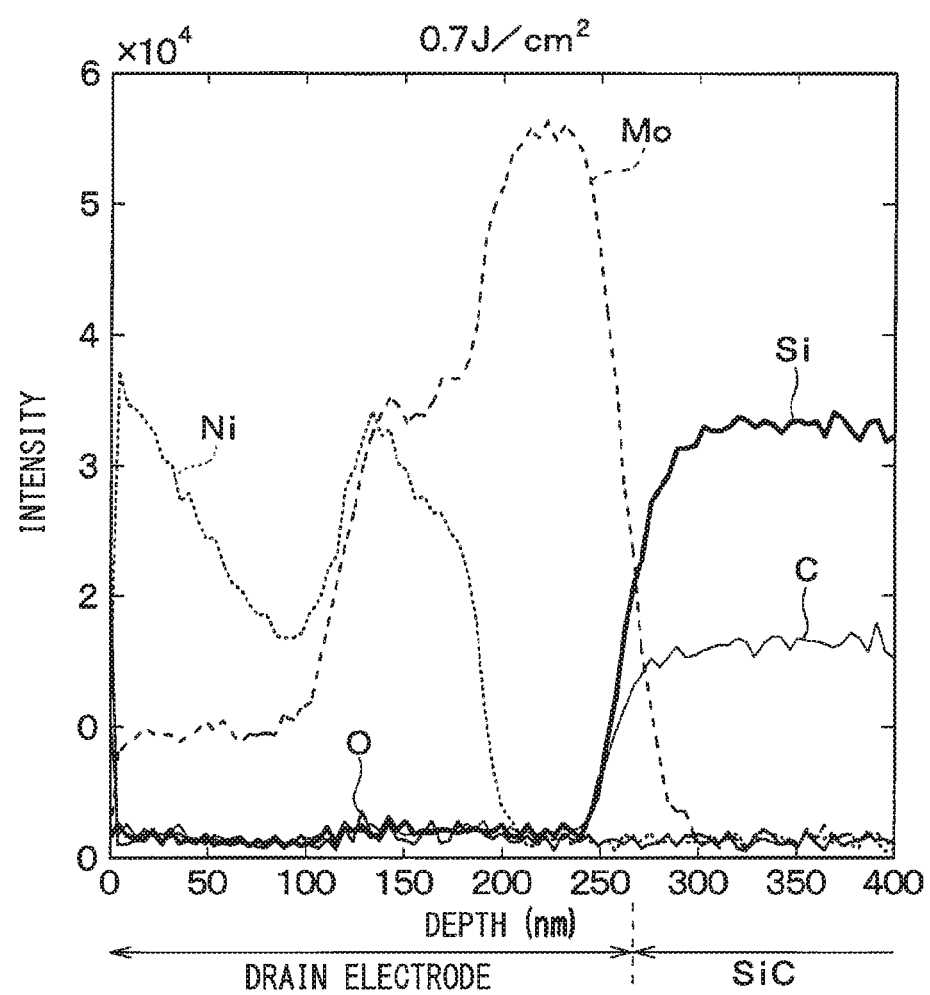
FIG. 8A is a diagram illustrating a result obtained by performing an element analysis when an energy density of a laser beam is 0.7 J/cm$^2$.
Figure 8B:
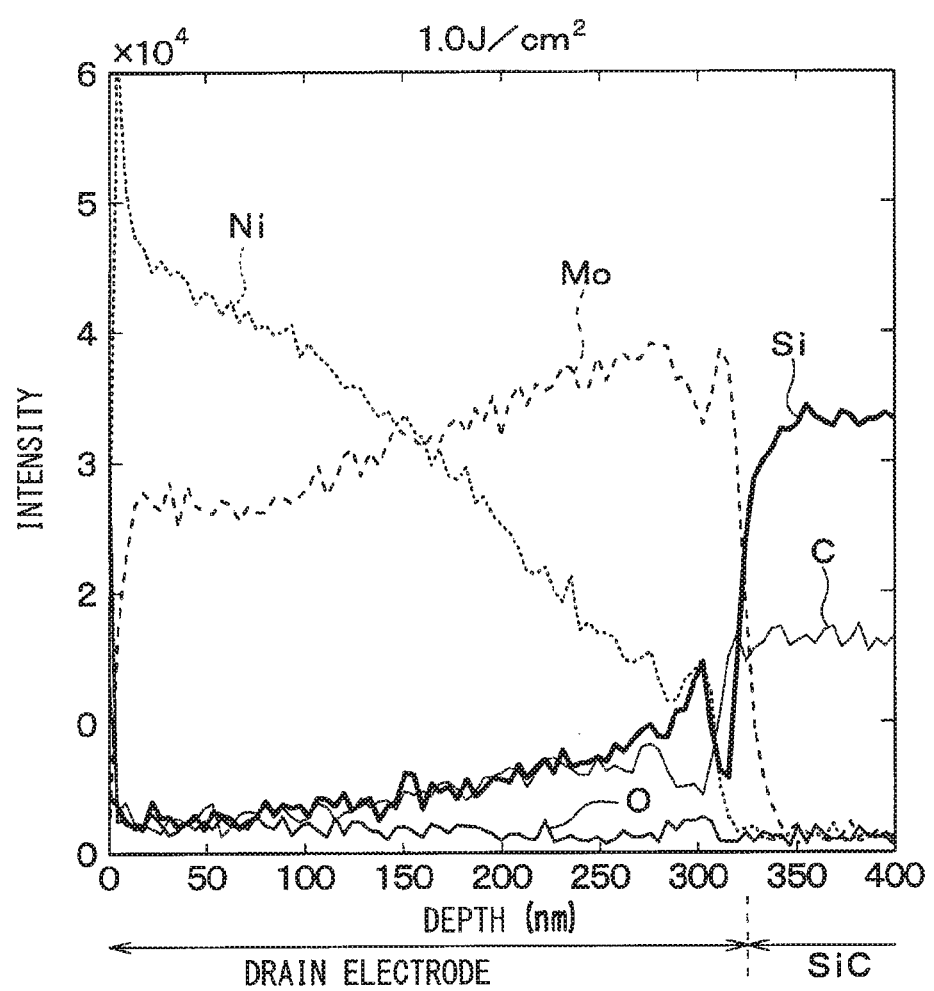
FIG. 8B is a diagram illustrating a result obtained by performing an element analysis when an energy density of a laser beam is 1.0 J/cm$^2$.
Figure 8C:
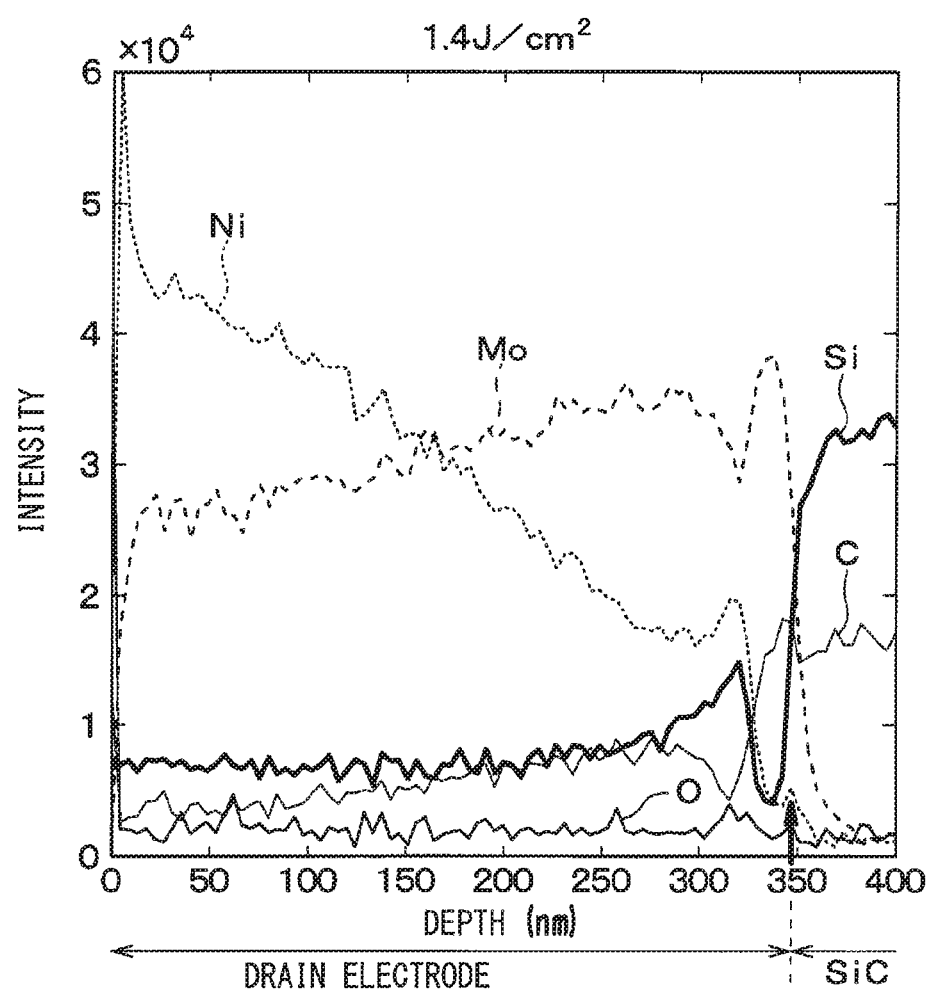
FIG. 8C is a diagram illustrating a result obtained by performing an element analysis when an energy density of a laser beam is 1.4 J/cm$^2$.
Figure 8D:
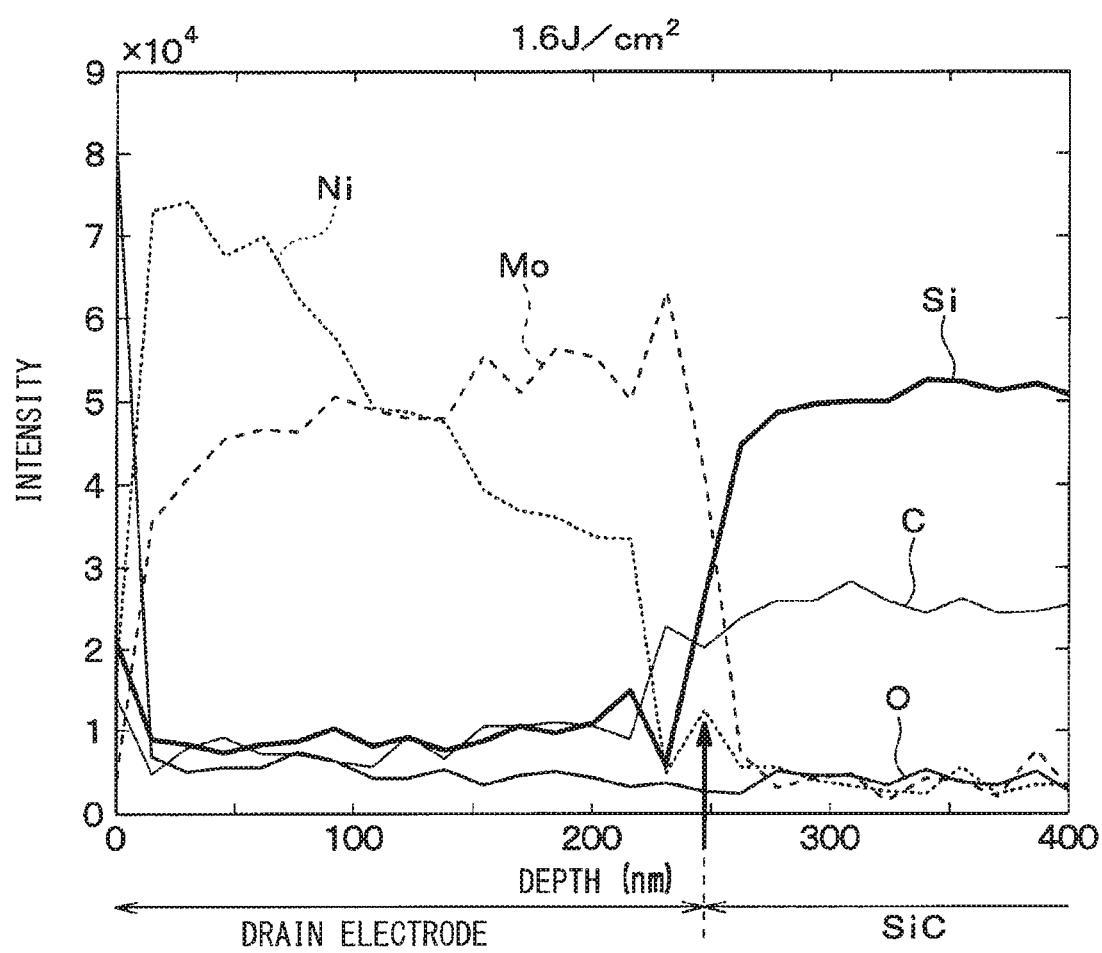
FIG. 8D is a diagram illustrating a result obtained by performing an element analysis when an energy density of a laser beam is 1.6 J/cm$^2$.
Figure 8E:
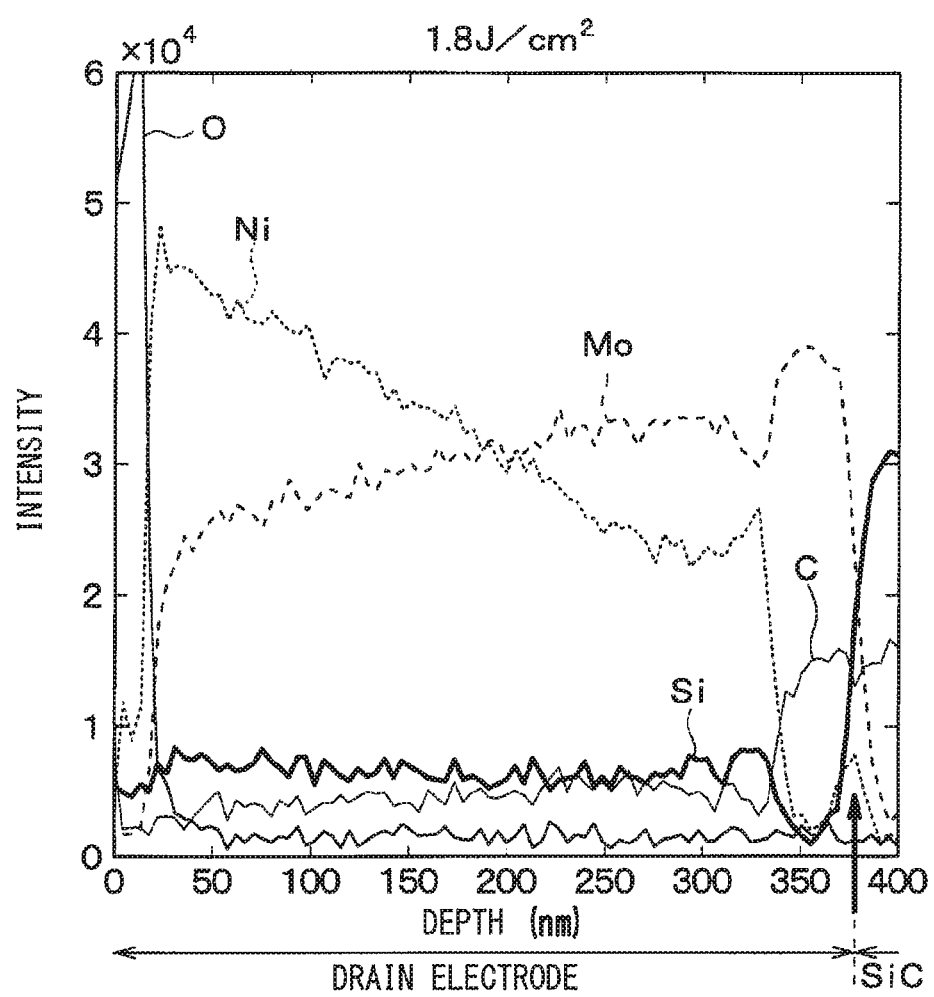
FIG. 8E is a diagram illustrating a result obtained by performing an element analysis when an energy density of a laser beam is 1.8 J/cm$^2$.
Figure 8F:
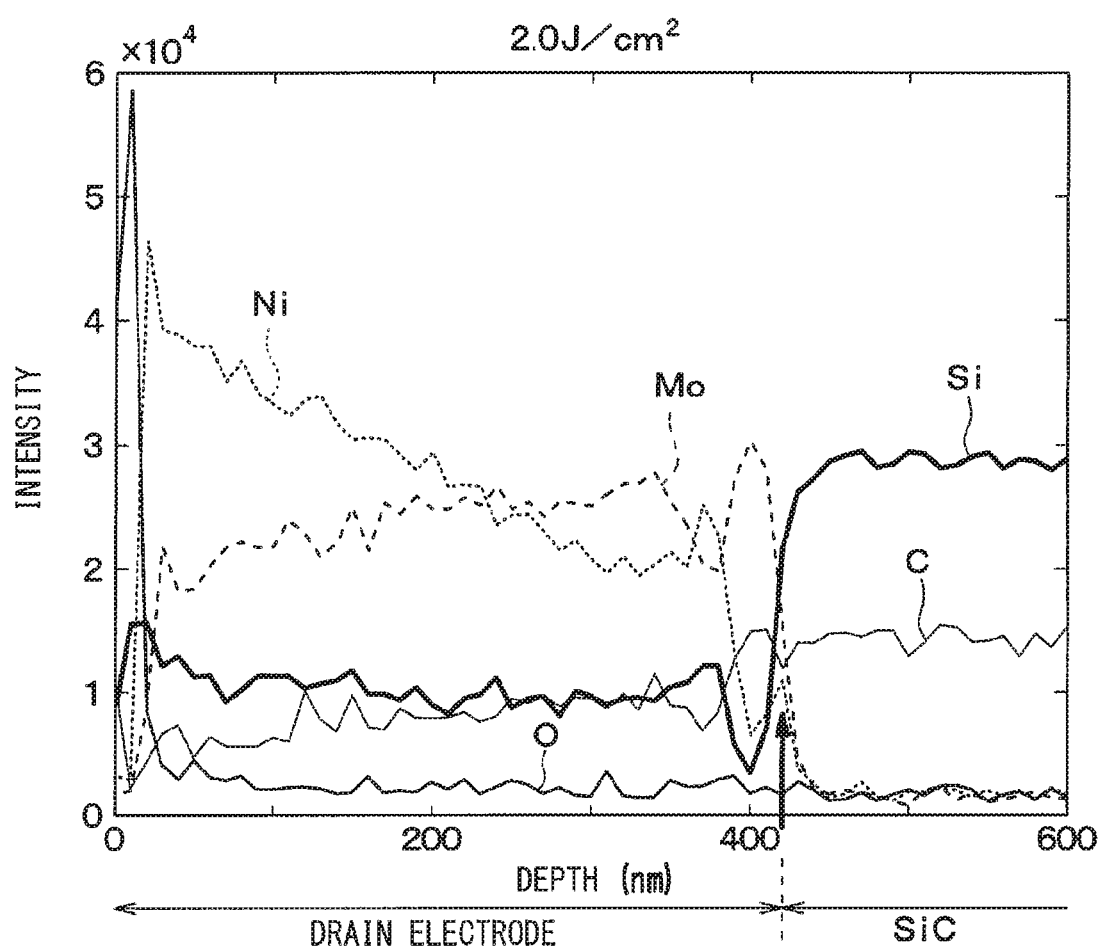
FIG. 8F is a diagram illustrating a result obtained by performing an element analysis when an energy density of a laser beam is 2.0 J/cm$^2$.

In FIGS. 8A to 8F, the portions in which intensities of Si and C become high indicate the n+-type SiC substrate 1, and the portions in which the intensities of Ni and Mo become high indicate the drain electrode 11. As illustrated in FIGS. 8A and 8B, when the energy density of the laser beam 50 is set to be 0.7 and 1.0 J/cm², a portion of a boundary position of the drain electrode 11 with the n+-type SiC substrate 1 is occupied by Mo, and Ni is in a state of hardly being present. From the result, it is understood that the Mo carbide 11b is in a state of adhering to the rear surface of the SiC substrate 1, when the energy density of the laser beam 50 is set to be 1.0 J/cm² or less.

On the contrary, as illustrated in FIGS. 8C to 8F, when the energy density of the laser beam 50 is set to be 1.4 to 2.0 J/cm², it can be confirmed that Ni is present in the portion of the boundary position the drain electrode 11 with the n+-type SiC substrate 1, as indicated by an arrow in the drawing. From the result, when the energy density of the laser beam 50 is set to be 1.4 J/cm² or more, it is understood that the Ni silicide 11a is in a state of entering into the gap between the Mo carbide 11b and the rear surface of the n+-type SiC substrate 1.

In this manner, the structure in which the Ni silicide 11a enters into the space between the Mo carbide 11b and the SiC in the contact portion of the drain electrode 11 with the n+-type SiC substrate 1, is made. Therefore, it is considered that a contact area between the Ni silicide 11a and the SiC is increased, an electrical current path can be expanded, and the contact resistance can be reduced as described above. Such a structure is realized by the laser annealing in which the energy density of the laser beam 50 is set to be 1.4 J/cm² or more. Accordingly, reduction of the contact resistance can be further achieved while a damage on the device by performing local heating is prevented.

The subsequent steps are not illustrated in the drawing, but the n+-type SiC substrate 1 on which the device forming is performed, is divided as a chip unit by blade dicing or the like. Thereby, the SiC semiconductor device that includes the vertical power MOSFET illustrated in FIG. 1 according to the present embodiment, is completed.

As described above, in the present embodiment, the contact portion of the drain electrode 11 which becomes the ohmic electrode with the rear surface 1b of the n+-type SiC substrate 1 is formed by the Ni silicide 11a and the Mo carbide 11b. Therefore, the structure in which the Mo carbide 11b is separated from the rear surface 1b of the $n^+$-type SiC substrate 1, and the Ni silicide 11a is interposed between the Mo carbide 11b and the rear surface 1b of the $n^-$-type SiC substrate 1, is made.

In this manner, in the structure in which the Ni silicide 11a is formed, the reduction of the contact resistance can be achieved by making the structure which is capable of preventing the precipitation of the graphite such that the Mo carbide 11b is generated. The structure in which the Ni silicide 11a enters into the gap between the Mo carbide 11b and the rear surface 1b of the $n^+$-type SiC substrate 1 while the Mo carbide 11b is formed into the block shape having crystallinity, is made. Therefore, the contact area between the Ni silicide 11a and the SiC is increased, the electrical current path can be expanded, and the contact resistance can be further reduced. Accordingly, further favorable ohmic characteristics are obtained.

Other Embodiments

For example, in the first embodiment, the ohmic electrode on the rear surface side of the device in which each component is provided on the front surface side of the SiC substrate, is described as an example. However, the structure described in the first embodiment can be applied to not only the rear surface side in a case where each component is provided on the front surface side of the SiC substrate, but also any portion as long as the structure is configured to be a structure in which the ohmic electrode is provided with respect to the SiC. For example, the structure described in the first embodiment can be applied to a case where the ohmic electrode is formed on the front surface side of the SiC substrate. Even in this case, when a configuration in which the ohmic electrode is formed after each component of the device is formed is made, the laser annealing is used, thereby, the local heating can be performed, and an influence on the device can be prevented.

In the first embodiment, the laser annealing is exemplified, as an example of the producing step that realizes the structure in which the metal silicide enters into the gap between the metal carbide and the SiC. The laser annealing is effective at a point of having effects that the local heating is performed, and the influence on the device can be prevented, but the effects as those of the first embodiment can be obtained, even in a case where the above structure is realized by another method, for example, lamp annealing regardless of the laser annealing. A case where the solid-state laser is used as an example of the laser annealing is described, but the laser is not limited to the solid-state laser, and an excimer laser or the like can be used, for example. When the excimer laser is used, it is preferable that the energy density is set to be 1.4 J/cm$^2$ or more while the laser having the wavelengths of 248 nm and 308 nm, for example, is used.

In the first embodiment, the SiC semiconductor device that includes the vertical power MOSFET as a semiconductor element is described as an example, but it is merely an example, the SiC semiconductor device may include other semiconductor elements such as a diode and an IGBT. That is, the SiC semiconductor device may be any as long as the SiC semiconductor device is configured to include the ohmic electrode with respect to the semiconductor element which is provided on the semiconductor substrate formed of the SiC.

As described above, a case where the metal silicide is formed as a first metallic material 110a such as Ni, Co, or Nb, and the metal carbide is formed as a second metallic material 110b such as Mo, Ti, Nb, W, or Ta, can be used. Among the metals, regarding the materials which can be used for both of the first metallic material and the second metallic material, the metal silicide is formed, or the metal carbide is formed by a combination of the materials. For example, regarding Ti and Nb, the metal carbide is formed by being combined with Ni and playing a role as a second metallic material, but the metal silicide is formed by being combined with W, Ta, or the like and playing a role as a first metallic material.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A silicon carbide semiconductor device comprising:
   a semiconductor substrate that has a front surface and a rear surface, and is made of silicon carbide; and
   an ohmic electrode that is ohmically connected to the front surface or the rear surface of the semiconductor substrate, wherein:
   the ohmic electrode includes a metal silicide part and a metal carbide part;
   the metal silicide part surrounds a periphery of the metal carbide part that has a block shape; and
   the metal silicide part is disposed between the semiconductor substrate and the metal carbide part.

2. The silicon carbide semiconductor device according to claim 1, wherein:
   the metal carbide part has crystallinity.

3. The silicon carbide semiconductor device according to claim 1, wherein:
   the metal silicide part is amorphous.

4. The silicon carbide semiconductor device according to claim 1, wherein:
   each block of the metal carbide part having the block shape has a maximum dimension which is equal to or more than 3 nm and equal to or less than 40 nm.

5. The silicon carbide semiconductor device according to claim 1, wherein:
   a thickness of a portion of the metal silicide part positioned between the semiconductor substrate and the metal carbide is equal to or more than 1 nm and equal to or less than 3 nm.

6. The silicon carbide semiconductor device according to claim 1, wherein:
   the metal silicide part includes a Ni silicide portion; and
   the metal carbide part includes a Mo portion.

* * * * *